(12) United States Patent
Wu

(10) Patent No.: US 11,837,124 B2
(45) Date of Patent: Dec. 5, 2023

(54) METHOD FOR TESTING LIGHT-EMITTING ELEMENTS, TESTING DEVICE, AND SUBSTRATE

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventor: Hung-Chih Wu, Chengdu (CN)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 386 days.

(21) Appl. No.: 17/208,022

(22) Filed: Mar. 22, 2021

(65) Prior Publication Data

US 2022/0148471 A1 May 12, 2022

(30) Foreign Application Priority Data

Nov. 6, 2020 (CN) .......................... 202011228993.X

(51) Int. Cl.
  *G09G 3/00* (2006.01)
  *H01L 33/62* (2010.01)
  (Continued)

(52) U.S. Cl.
  CPC ......... *G09G 3/006* (2013.01); *G01R 31/2635* (2013.01); *H01L 33/32* (2013.01); *H01L 33/62* (2013.01)

(58) Field of Classification Search
  CPC .......... G09G 3/006; G09G 3/32; H01L 33/32; H01L 33/62; H01L 25/0753; H01L 22/12; H01L 22/32
  See application file for complete search history.

(56) References Cited

U.S. PATENT DOCUMENTS

2015/0214197 A1* 7/2015 Ohmae .................. H01L 24/48
                                                      257/88
2018/0226384 A1* 8/2018 Park ...................... H01L 33/58
(Continued)

FOREIGN PATENT DOCUMENTS

TW           578800 U  *  6/2019

*Primary Examiner* — Tracie Y Green
(74) *Attorney, Agent, or Firm* — ScienBiziP, P.C.

(57) ABSTRACT

A method for testing light-emitting elements includes: providing a substrate having light-emitting elements and conductive wires; providing at least one coil structure including a first coil and two conductive plugs connected to the first coil; providing a metal rod and a second coil winding the metal rod and connected to an AC power supply. Each light-emitting element includes a positive electrode and a negative electrode connected to one conductive wire, respectively. The substrate defines pairs of through holes, each pair of through holes is aligning with two conductive wires connected to the positive electrode and the negative electrode of one light-emitting element. The testing method further includes inserting the two conductive plugs into one pair of through holes, starting the AC power supply and moving the metal rod towards the coil structure to form an induced current in the first coil configured for driving the one light-emitting element.

11 Claims, 6 Drawing Sheets

(51) Int. Cl.
  *H01L 33/32* (2010.01)
  *G01R 31/26* (2020.01)

(56) References Cited

U.S. PATENT DOCUMENTS

2020/0225277 A1\* 7/2020 Kuo .................. G01R 1/07314
2023/0130127 A1\* 4/2023 Abid ...................... H01L 24/48
                                                              438/68

\* cited by examiner

Providing a substate having a plurality of light-emitting elements and a plurality of conductive wires; each light-emitting element comprising a positive electrode connecting to one conductive wire and a negative electrode connecting to one conductive wire; the substrate defining a plurality of pairs of through holes, each pair of through holes aligning with two conductive wires — S1

Providing at least one coil structure, each coil structure comprising a first coil and two conductive plugs each connecting to one of opposite ends of the first coil — S2

Providing a metal rod and a second coil winding the metal rod, the second coil electrically connecting to an alternating current (AC) power supply — S3

Inserting the two conductive plugs into one pair of through holes to electrically couple the first coil and one light-emitting element, starting the AC power supply and moving the metal rod towards the coil structure — S4

FIG. 1

METHOD FOR TESTING LIGHT-EMITTING ELEMENTS, TESTING DEVICE, AND SUBSTRATE

FIELD

The subject matter herein generally relates to a testing method for testing light-emitting elements, a testing device for testing light-emitting elements, and a substrate.

BACKGROUND

A size of a micro light-emitting element is relatively small. A number of the micro light-emitting elements mounted on a substrate is usually in tens of thousands. In the prior art, probes are used to directly contact electrodes of the micro light-emitting element to test and determine whether the micro light-emitting element can emit light normally. Since there is a large number of micro light-emitting elements on the substrate and the size of each micro light-emitting element is small, the distance between adjacent micro light-emitting elements is also very small, and accurately contacting the electrodes of the micro light-emitting element when testing a single micro light-emitting element is laborious and time-consuming. Direct physical contact with the micro light-emitting elements may also introduce risk of damaging the micro light-emitting elements.

Therefore, there is room for improvement in the art.

BRIEF DESCRIPTION OF THE DRAWINGS

Implementations of the present technology will now be described, by way of embodiments only, with reference to the attached figures.

FIG. 1 is a flow chart of a method for testing light-emitting elements according to an embodiment of the present disclosure.

DETAILED DESCRIPTION

Figure 2:
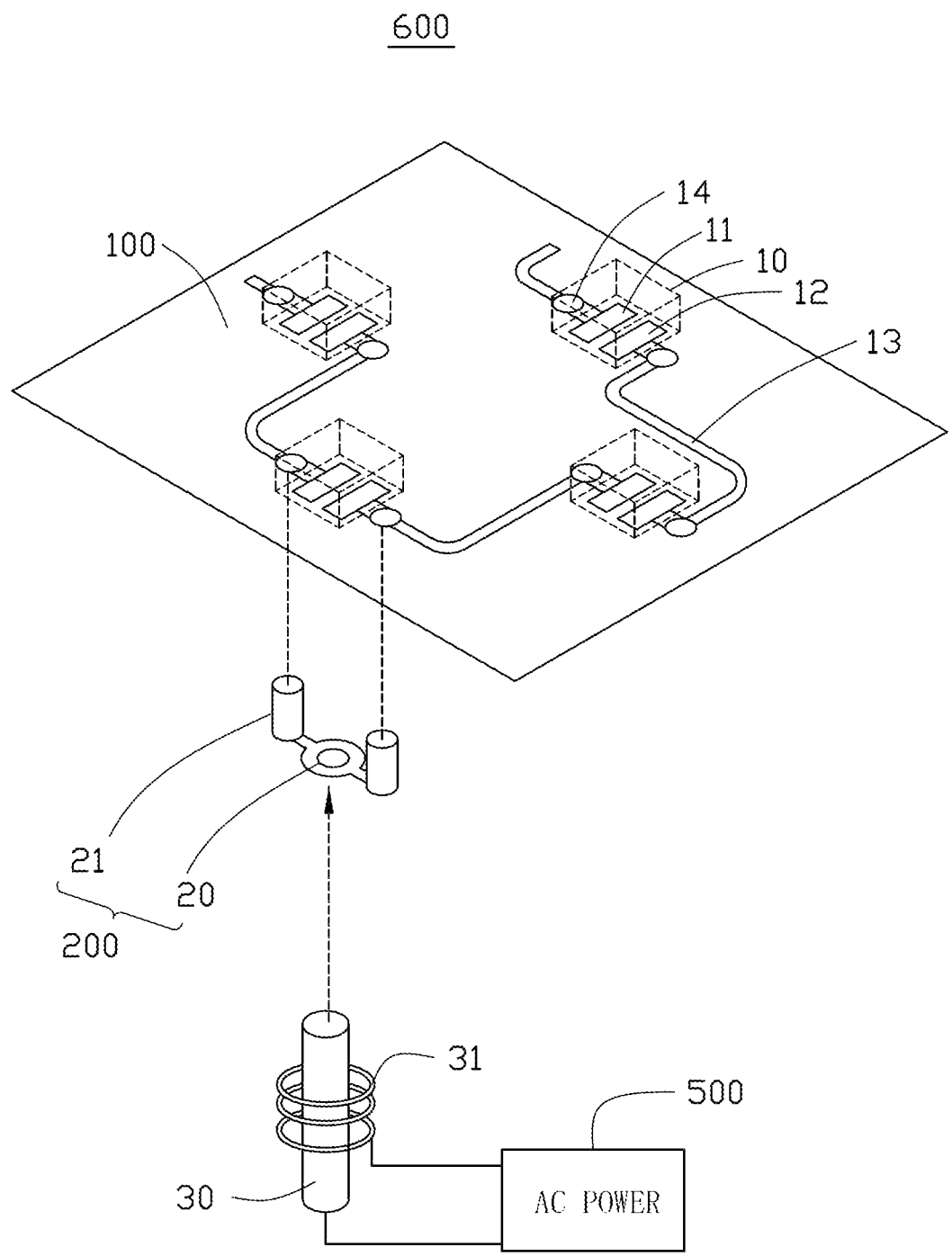
FIG. 2 is an isometric view of a substrate, a coil structure, a metal rod, and a second coil of the present disclosure.
Figure 3:
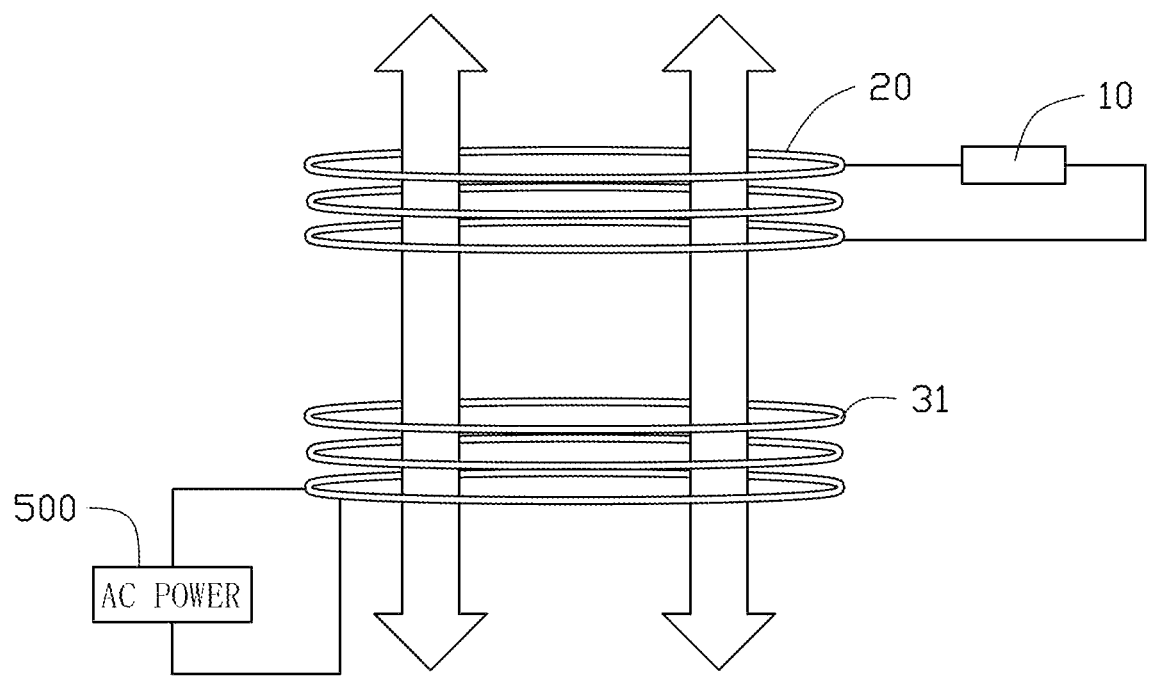
FIG. 3 is a schematic view showing electromagnetic induction between the first coil and the second coil in the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

Referring to FIG. 1, one embodiment of a method for testing light-emitting elements includes the following steps S1 to S4.

Step S1: a substrate 10 having a plurality of light-emitting elements for testing and a plurality of conductive wires are provided.

Each light-emitting element includes a positive electrode and a negative electrode. The positive electrode and the negative electrode of each light-emitting element are each connected to one conductive wire. The substrate is defined with a plurality of pairs of through holes. Each pair of through holes corresponds to one light-emitting element and is aligned with conductive wires in contact with the positive electrode and the negative electrode of the one light-emitting element.

Step S2: a coil structure is provided.

The coil structure includes a first coil and two conductive plugs, each of the two conductive plugs are electrically connected to an opposite end of the first coil.

Step S3: a metal rod and a second coil winding the metal rod are provided. The second coil is electrically connected to an alternating current (AC) power supply.

Step S4: when testing the light-emitting element on the substrate, the two conductive plugs of the coil structure are inserted into one pair of through holes corresponding to one light-emitting element to electrically connect the first coil to the one light-emitting element. Upon activation of the AC power supply, and the metal rod being moved toward the coil structure, a current is induced in the first coil to test and drive the one light-emitting element to emit light.

In this embodiment, if a light-emitting element 10 does not emit light, the light-emitting element 10 is considered to be failure; or if it is detected that the light-emitting element 10 emits light, but optical characteristics of the light-emitting element 10 are not as required, the light-emitting element 10 is considered to be failure. The optical characteristics may include luminous flux, luminous efficiency, luminous intensity, luminous intensity distribution, and wavelength.

As shown in FIG. 2, the coil structure 200, the metal rod 30, and the second coil 31 are used to test whether a light-emitting element 10 is valid according to the principle of electromagnetic induction. During a testing process, the two conductive plugs 21 of the coil structure 200 are inserted into a pair of through holes 14 corresponding to one light-emitting element 10, so that opposite ends of the first coil 20 of the coil structure 200 are electrically connected to the positive electrode 11 and the negative electrode 12 of the light-emitting element 10. When the AC power supply 500 electrically connected to the second coil 31 is powered on, and the metal rod 30 is moved toward the first coil 20, the first coil 20 generates an induced current to drive the light-emitting element 10 to emit light as magnetic flux of the second coil 31 changes, thus induced current is used to test the light-emitting element 10. In this embodiment, the first coil 20 and the second coil 31 are made of metal wires, which can be but are not limited to copper wires.

In this embodiment, all of the light-emitting elements 10 are located on a same surface of the substrate 100. In this embodiment, each through hole 14 extends through the substrate 100 and intersects or over-intersects with a projection of one conductive wire 13 on the substrate 100. When the conductive plug 21 is inserted into the through hole 14 corresponding to one light-emitting element 10, the conductive plug 21 is in electrical contact with the conductive wiring 13 crossing the through hole 14.

Before starting the test, the coil structure 200 is located on a side of the substrate 100 away from the light-emitting elements 10. The metal rod 30 is located on a side of the coil structure 200 away from the substrate 100 and faces the first coil 20. After starting the AC power supply 500 and beginning the test, the metal rod 30 is moved to bring the second coil 31 closer to the first coil 20 along a central axis of the first coil 31, so that the first coil 20 generates induced current to drive the light emitting element 10 to emit light.

Figure 4:
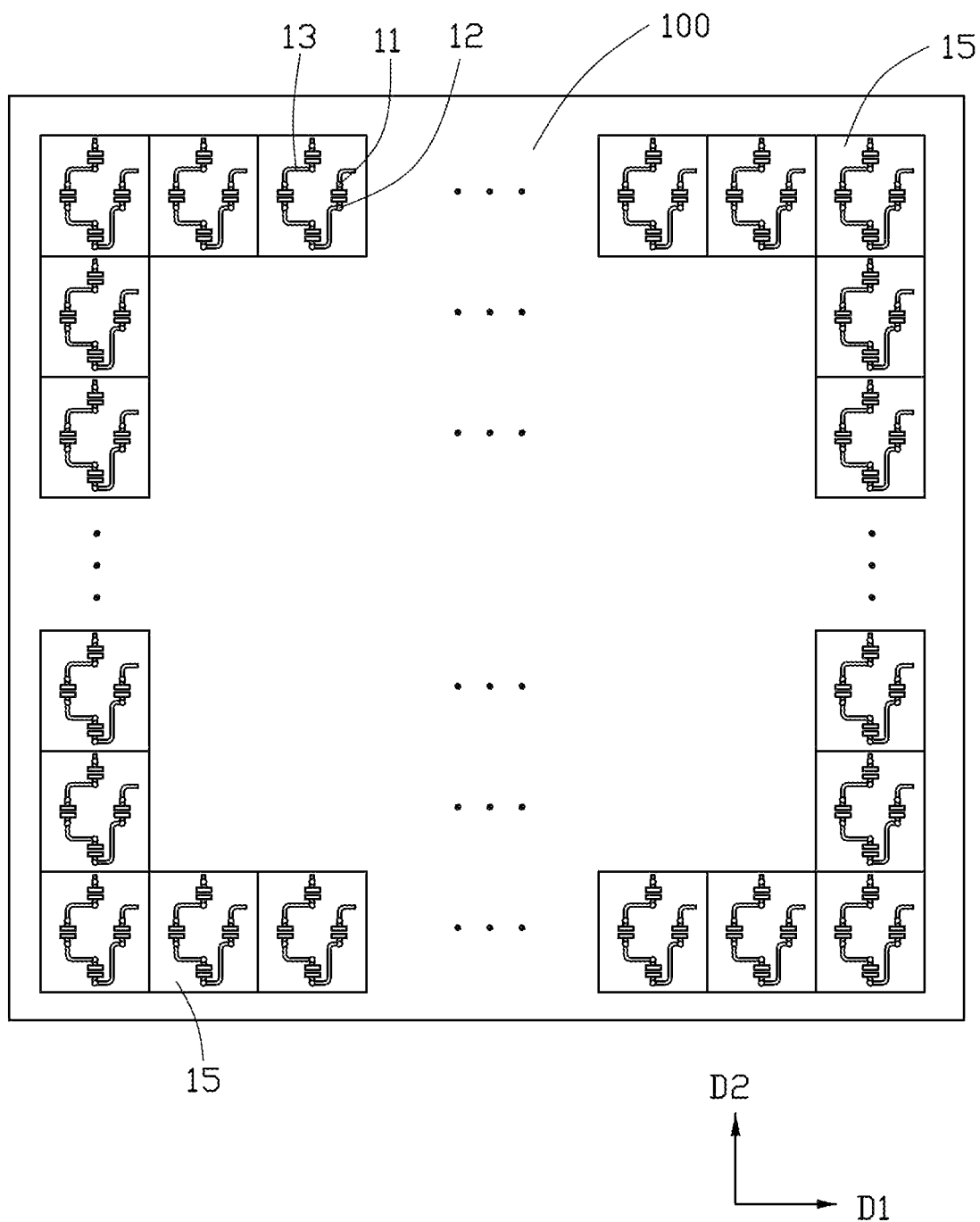
FIG. 4 is a schematic view showing sub-units of the substrate according to the embodiment of the present disclosure.

As shown in FIG. 4, in this embodiment, the substrate 100 includes a plurality of sub-units 15 arranged in a matrix, and each sub-unit 15 is provided with at least two light emitting elements 10. In this embodiment, the sub-units 15 are arranged in a plurality of rows parallel to a first direction D1 and a plurality of columns parallel to a second direction D2, the direction D2 intersects with the first direction D1. A number of light-emitting elements 10 in each sub-unit 15 is the same. In this embodiment, the first direction D1 and the second direction D2 are perpendicular to each other. The arrangement of the light-emitting elements 10 on the substrate 100 is not limited, and can be matrix arrangement or other arrangement. The arrangement of the light-emitting elements 10 in the sub-unit 15 is not limited, and the light-emitting elements 10 in each sub-unit 15 can be matrix arrangement or other arrangement. FIG. 4 shows the light emitting elements 10 arranged as a non-matrix on the substrate 100.

In this embodiment, the light emitting elements 10 in each sub-unit 15 are connected in series or in parallel. FIG. 4 shows the light emitting elements 10 in each sub-unit 15 being connected in series.

Figure 5:
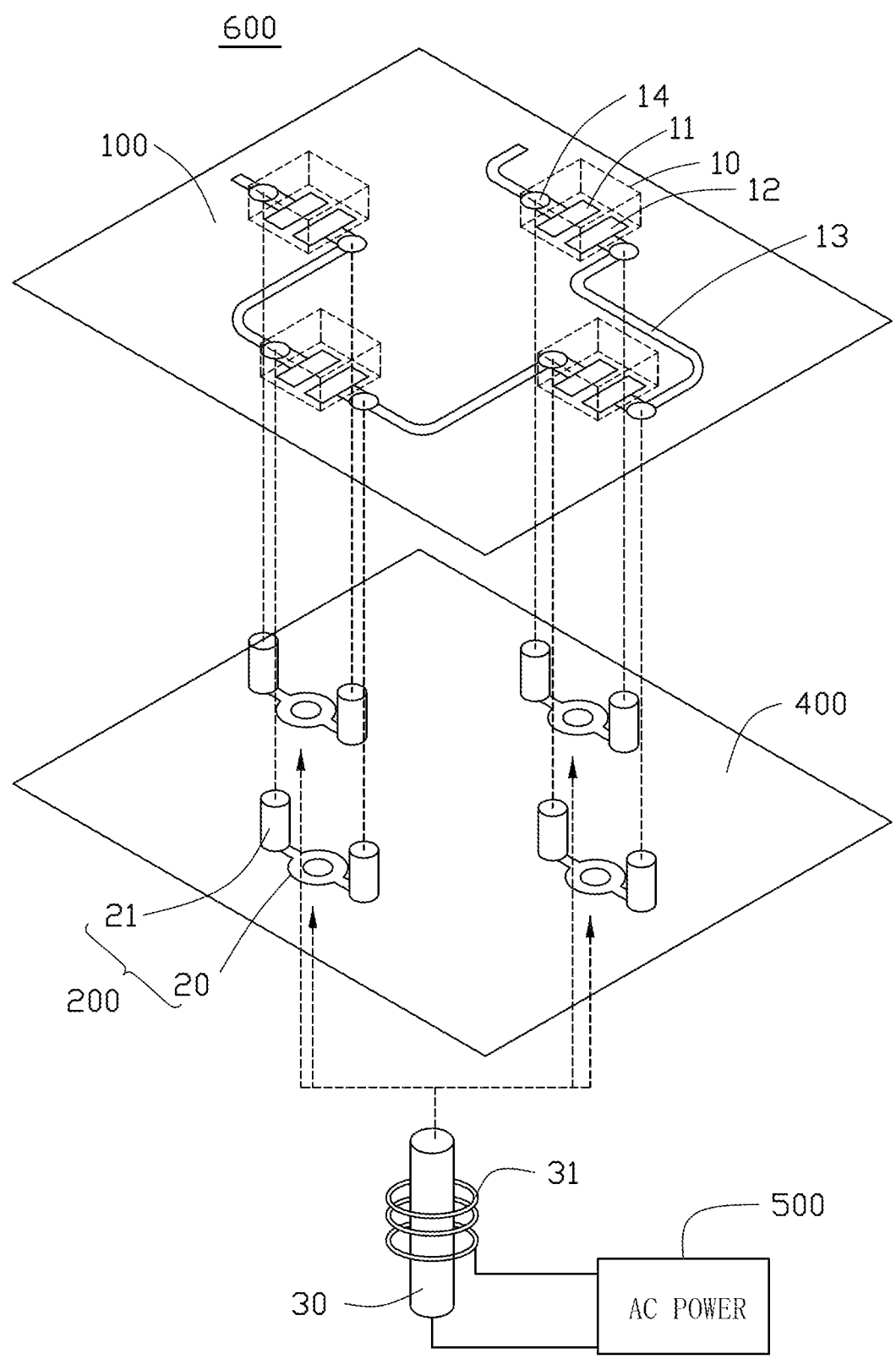
FIG. 5 is a schematic view showing a plugboard corresponding to a sub-unit of the substrate of FIG. 4.

As shown in FIG. 5, the step S2 of providing the coil structure 200 further includes: providing a plugboard 400 and setting at least one coil structure 200 on a surface of the plugboard 400. When testing the light-emitting elements 10, the plugboard 400 is placed on the side of the substrate 100 away from the light-emitting elements 10, and a side of the plugboard 400 having the coil structure 200 faces the substrate 100.

In one embodiment, the plugboard 400 is provided with a plurality of coil structures 200, and the coil structures 200 and the light-emitting elements 10 in a sub-unit 15 are arranged in a one-to-one correspondence. When the light-emitting elements 10 are being tested, the coil structures 200 and the light-emitting elements 10 in the sub-unit 15 are electrically connected in one-to-one correspondence. A number of the coil structures 200 on the plugboard 400 is equal to a number of light-emitting elements 10 in the sub-unit 15. Specifically, when the plugboard 400 is used to test the light-emitting elements 10, the plugboard 400 is placed so as to be facing the sub-unit 15, and the coil structures 200 are electrically connected to the light-emitting elements 10 in the sub-unit 15 one-on-one. The at least one metal rod 30 and the second coil 31 wound on the metal rod 30 are arranged on a side of the plugboard 400 away from the substrate 100. The AC power supply 500 is started, and a metal rod 30 is gradually brought closer to the light-emitting element 10 to be tested, so that the first coil 20 in electrical connection with the light-emitting element 10 is induced to generate current to drive the light-emitting element 10 in the sub-unit 15 to emit light. In one embodiment, the quantity of metal rods 30 and second coils 31 is the same as that of light-emitting elements 10 in one sub-unit 15, and the metal rods 30 are used to test the light-emitting elements 10 in the sub-unit 15 one by one.

Figure 6:
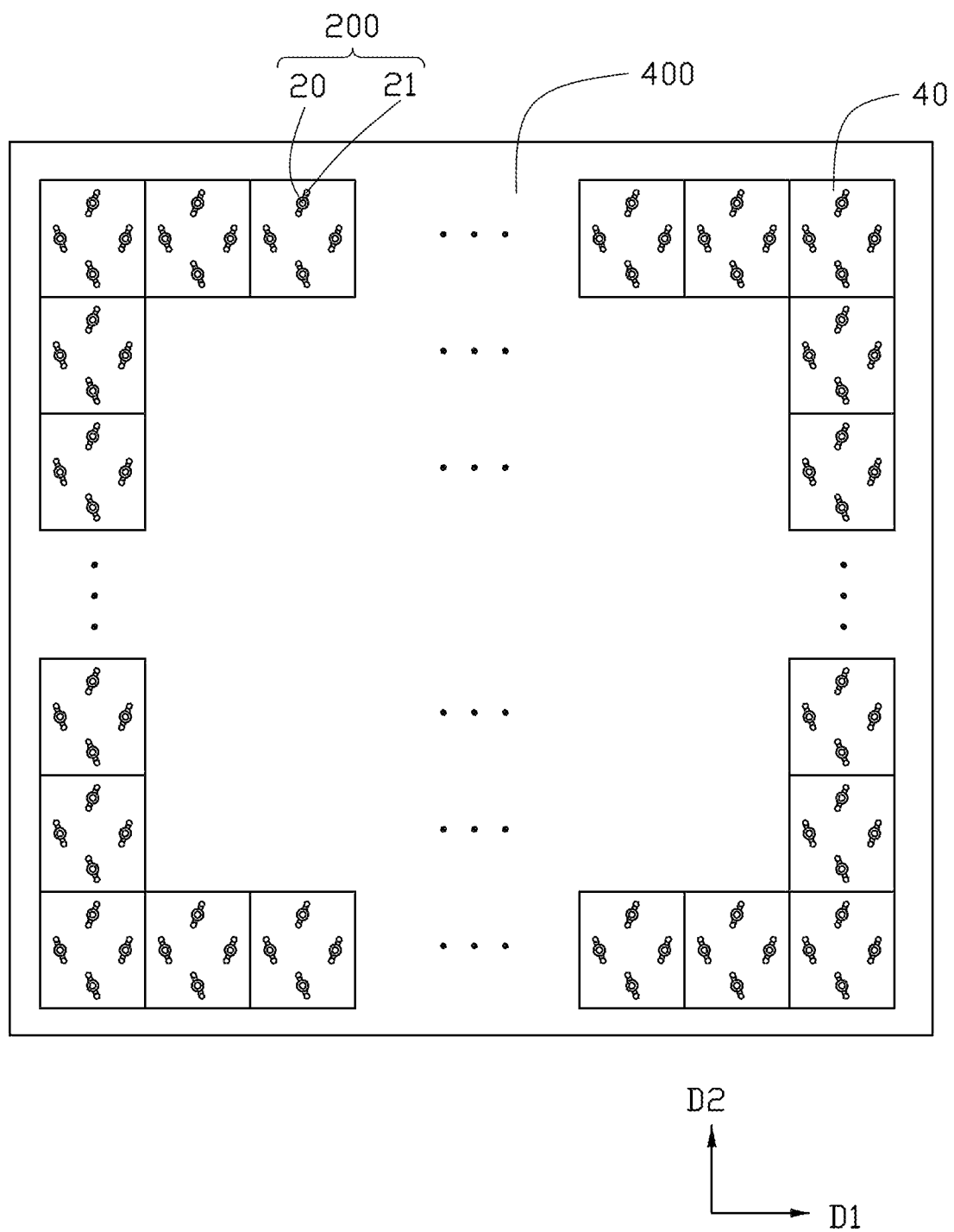
FIG. 6 is a schematic view showing multiple regions of the plugboard of the embodiment of the disclosure.

In one embodiment, as shown in FIG. 6, the plugboard 400 is provided with a plurality of coil structures 200, and the coil structures 200 and the light-emitting elements 10 on the substrate 100 are arranged one-to-one correspondingly. When testing the light-emitting elements 10, the coil structures 200 and the light-emitting elements 10 on the substrate 100 are electrically connected one-to-one. In this embodiment, the coil structures 200 on the plugboard 400 can be used to test all the light-emitting elements 10 on the substrate 100.

Specifically, the plugboard 400 includes a plurality of regions 40. The regions 40 are arranged in a plurality of rows parallel to the first direction D1 and a plurality of columns parallel to the second direction D2. The number of regions 40 is equal to a number of the sub-units 15 and correspond to the sub-units 15 one-on-one. When testing the light-emitting elements 10, the plugboard 400 is placed to face the substrate 100, and the coil structures 200 of each area 40 are electrically connected to the light-emitting elements 10 of each sub-unit 15. At least one metal rod 30 and the second coil 31 wound on the metal rod 30 are arranged on a side of the plugboard 400 away from the substrate 100. Then the AC power supply 500 is started, and the metal rod 30 is moved gradually toward the plugboard 400 and approaches the light-emitting elements 10 to be tested, so that the first coil 20 electrically connected to the light-emitting element 10 is induced to generate current to drive the light-emitting element 10 to emit light. The coil structures 200 in each region 40 are used to drive the light-emitting elements 10 in one sub-unit 15 to emit light. In this embodiment, an arrangement of the coil structures 200 in each area 40 is not limited. As long as a number of the coil structures 200 in each region 40 and a number of the light-emitting elements 10 in each sub-unit 15 are the same and correspond one-on-one, the coil structures 200 in each region 40 can be used for one-to-one electrical connection to the light-emitting elements 10 in each sub-unit 15.

The method for testing the light-emitting elements in the present disclosure is particularly suitable for the case that each light-emitting element 10 is a micro-scale light-emitting element. A size of each light-emitting element 10 can be between 50 μm and 200 μm. That is, each light-emitting element 10 is a mini light-emitting diode and a micro light-emitting diode. In a conventional testing process of the light-emitting element 10, when the light-emitting element 10 is small, achieving accurate contact with the positive electrode 11 and the negative electrode 12 of the micro light-emitting element 10 when testing a single micro light-emitting element is complex and time-consuming. The method of the disclosure does not require direct physical contact with the positive electrode 11 and the negative electrode 12 of the light-emitting element 10, thus saving time. In this embodiment, a single micro light-emitting element 10 can be driven to emit light with only a small easily-generated current, such as 1 mA. In other embodiments, the light-emitting element 10 can also be a miniature light-emitting diode having a size less than 50 μm.

In this embodiment, during a testing process, the two conductive plugs 21 of the coil structure 200 are inserted into a pair of through holes 14 corresponding to one light-emitting element 10, so that the first coil 20 are electrically connected to the light-emitting element 10. The AC power supply 500 is powered on, and the metal rod 30 is moved towards the first coil 20, the first coil 20 generates an induced current to drive the light-emitting element 10 to emit light, thus depending on the induced current to test whether the light-emitting element 10 is good or bad. In the present disclosure, such method utilizing electromagnetic induction avoids damaging the light-emitting elements 10, which might otherwise be caused by direct contact with each light-emitting element 10 during the testing process. In a conventional testing of the light-emitting elements, testing is performed after the light-emitting elements 10 are fabricated on the substrate 100, and the driving circuits of the light-emitting elements 10 are also fabricated. The method of the present disclosure can test the light-emitting elements 10 during actual manufacture of the light-emitting elements 10 or as a later process.

The present disclosure also provides a testing device 600 for testing multiple light-emitting elements 10. The testing device 600 is used to test the light-emitting elements 10 on a substrate 100. The testing device 600 includes the coil structure 200, the metal rod 30, and the second coil 31.

In this embodiment, the coil structure 200 includes the first coil 20 and the two conductive plugs 21 connected to opposite ends of the first coil 20. The two conductive plugs 21 are configured to be inserted into a pair of through holes 14 corresponding to a light emitting element 10. The second coil 31 is wound around the metal rod 30 and is electrically connected to the AC power source 500.

In this embodiment, the substrate 100 carries the light-emitting elements 10 each of which including a positive electrode 11 and a negative electrode 12, and the substrate 100 is provided with conductive wires 13, each conductive wire 13 is in electrical connection with the positive electrode 11 or with the negative electrode 12. The substrate 100 is defined with a pair of through holes 14 corresponding to each light emitting element 10, and the conductive wires 13 connecting to the positive electrode 11 and the negative electrode 12 are respectively connected to one through hole 14.

As shown in FIG. 4, the substrate 100 includes a plurality of sub-units 15 arranged in a matrix, and each sub-unit 15 includes at least two light-emitting elements 10. The sub-units 15 are arranged in rows parallel to the first direction D1 and columns parallel to the second direction D2. In this embodiment, the light-emitting elements 10 on the substrate 100 can be arranged in a matrix or non-matrix arrangement; and the light-emitting elements 10 in each sub-unit 15 can be arranged in a matrix or non-matrix arrangement. FIG. 4 shows that the light-emitting elements 10 on the substrate 100 are arranged in a non-matrix arrangement.

As shown in FIG. 5 and FIG. 6, the testing device 600 further includes a plugboard 400. Coil structures 200 are on a surface of the plugboard 400.

In one embodiment, the coil structures 200 on the plug board 400 are arranged in a one-to-one correspondence with the light-emitting elements 10 of one sub-unit 15. The number of coil structures 200 on the plugboard 400 is the same as the number of light-emitting elements 10 in one sub-unit 15, as shown in FIG. 5. The coil structures 200 on the plugboard 400 apply current as required to test the light-emitting elements 10 in a sub-unit 15.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for testing light-emitting elements, comprising:
providing a substrate having a plurality of light-emitting elements to be tested and a plurality of conductive wires; each of the plurality of light-emitting elements comprising a positive electrode and a negative electrode, the positive electrode and the negative electrode connecting to one of the plurality of conductive wires, respectively; the substrate defining a plurality of pairs of through holes, each of the plurality of pairs of through holes aligning with two of the plurality of conductive wires connecting to the positive electrode and the negative electrode of one of the plurality of light-emitting elements;
providing at least one coil structure, each coil structure comprising a first coil and two conductive plugs, each of the two conductive plugs connecting to one of opposite ends of the first coil;
providing a metal rod and a second coil winding the metal rod, the second coil electrically connecting to an alternating current (AC) power supply;
inserting the two conductive plugs into one of the plurality of pairs of through holes to electrically couple the first coil and one light-emitting element, starting the AC power supply and moving the metal rod towards the coil structure to form an induced current in the first coil configured for driving the one light-emitting element to emit light.

2. The method for testing light-emitting elements of claim 1, wherein providing the substrate comprises providing the substrate having the plurality of light-emitting elements on a same surface of the substrate; the coil structure is placed on a side of the substrate away from the plurality of light-emitting elements and the metal rod is placed on a side of the coil structure away from the substrate and aligned with the first coil when testing.

3. The method for testing light-emitting elements of claim 2, wherein providing the at least one coil structure comprises providing a plugboard, the at least one coil structure is on a surface of the plugboard.

4. The method for testing light-emitting elements of claim 3, wherein there are a plurality of coil structures on the plugboard.

5. The method for testing light-emitting elements of claim 4, wherein the plurality of coil structures and the light-emitting elements on the substrate are in a one-to-one correspondence; the plurality of coil structures and the plurality of light-emitting elements on the substrate are electrically connected in a one-to-one correspondence when test.

6. The method for testing light-emitting elements of claim 4, wherein providing the substrate comprises providing the substrate having a plurality of sub-units arranged in a matrix; at least two of the plurality of light-emitting elements are in each of the plurality of sub-units; the plurality of coil structures and the light-emitting elements on one of the plurality of sub-units are in a one-to-one correspondence; the plurality of coil structures and the light-emitting elements on one of the plurality of sub-units are electrically connected in a one-to-one correspondence when test.

7. The method for testing light-emitting elements of claim 6, wherein the light emitting elements in each of the plurality of sub-units are connected in series or in parallel.

8. A testing device for light-emitting elements, comprising:
- at least one coil structure, each coil structure comprising a first coil and two conductive plugs, each of the two conductive plugs connected to one of opposite ends of the first coil;
- a metal rod; and
- a second coil winding the metal rod, the second coil electrically connected to an alternating current (AC) power supply.

9. The testing device for light-emitting elements of claim 8, further comprising a plugboard, wherein the at least one coil structure is on a surface of the plugboard.

10. The testing device for light-emitting elements of claim 9, wherein there are a plurality of coil structures on the plugboard.

11. The testing device for light-emitting elements of claim 8, wherein the testing device is configured to test light-emitting elements arranged on a substrate.

\* \* \* \* \*